United States Patent
Krivokapic et al.

(10) Patent No.: US 6,762,483 B1
(45) Date of Patent: Jul. 13, 2004

(54) NARROW FIN FINFET

(75) Inventors: Zoran Krivokapic, Santa Clara, CA (US); Judy Xilin An, San Jose, CA (US); Srikanteswara Dakshina-Murthy, Austin, TX (US); Haihong Wang, Fremont, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/348,910

(22) Filed: Jan. 23, 2003

(51) Int. Cl.$^7$ ............................................. H01L 29/06
(52) U.S. Cl. ........................ 257/618; 257/327; 257/347
(58) Field of Search ........................... 257/618, 327, 257/347

(56) References Cited

U.S. PATENT DOCUMENTS

| | | | |
|---|---|---|---|
| 6,583,469 B1 * | 6/2003 | Fried et al. | 257/329 |
| 2003/0042531 A1 * | 3/2003 | Lee et al. | 257/315 |
| 2004/0048424 A1 * | 3/2004 | Wu et al. | 438/154 |

OTHER PUBLICATIONS

Copy of U.S. Ser. No. 10/699,887; filed Nov. 4, 2003; entitled: "Self Aligned Damascene Gate"; 35 pages.

Digh Hisamoto et al.: "FinFET—A Self-Aligned Double–Gate MOSFET Scalable to 20 nm," IEEE Transactions on Electron Devices, vol. 47, No. 12, Dec. 2000, pp. 2320–2325.

Yang–Kyu Choi et al.: "Sub–20nm CMOS Fin FET Technologies," 0–7803–5410–9/99 IEEE, Mar. 2001, 4 pages.

Xuejue Huang et al.: "Sub–50 nm P–Channel Fin FET," IEEE Transactions on Electron Devices, vol. 48, No. 5, May 2001, pp. 880–886.

Yang–Kyu Choi et al.: "Nanoscale CMOS Spacer FinFET for the Terabit Era," IEEE Electron Device Letters, vol. 23, No. 1, Jan. 2002, pp. 25–27.

Xuejue Huang et al.: "Sub 50–nm FinFET: PMOS," 0–7803–7050–3/01 IEEE, Sep. 1999 4 pages.

Co–pending U.S. Application Ser. No. 10/614,052 filed Jul. 8, 2003 entitled: "Narrow Fins By Oxidation In Double–Gate FinFET," 11 page specification, 7 sheets of drawings.

* cited by examiner

*Primary Examiner*—David Nelms
*Assistant Examiner*—Tu-Tu Ho
(74) *Attorney, Agent, or Firm*—Harrity & Snyder LLP

(57) ABSTRACT

A method of forming fins for a double-gate fin field effect transistor (FinFET) includes forming a second layer of semi-conducting material over a first layer of semi-conducting material and forming double caps in the second layer of semi-conducting material. The method further includes forming spacers adjacent sides of each of the double caps and forming double fins in the first semi-conducting material beneath the double caps. The method also includes thinning the double fins to produce narrow double fins.

14 Claims, 7 Drawing Sheets

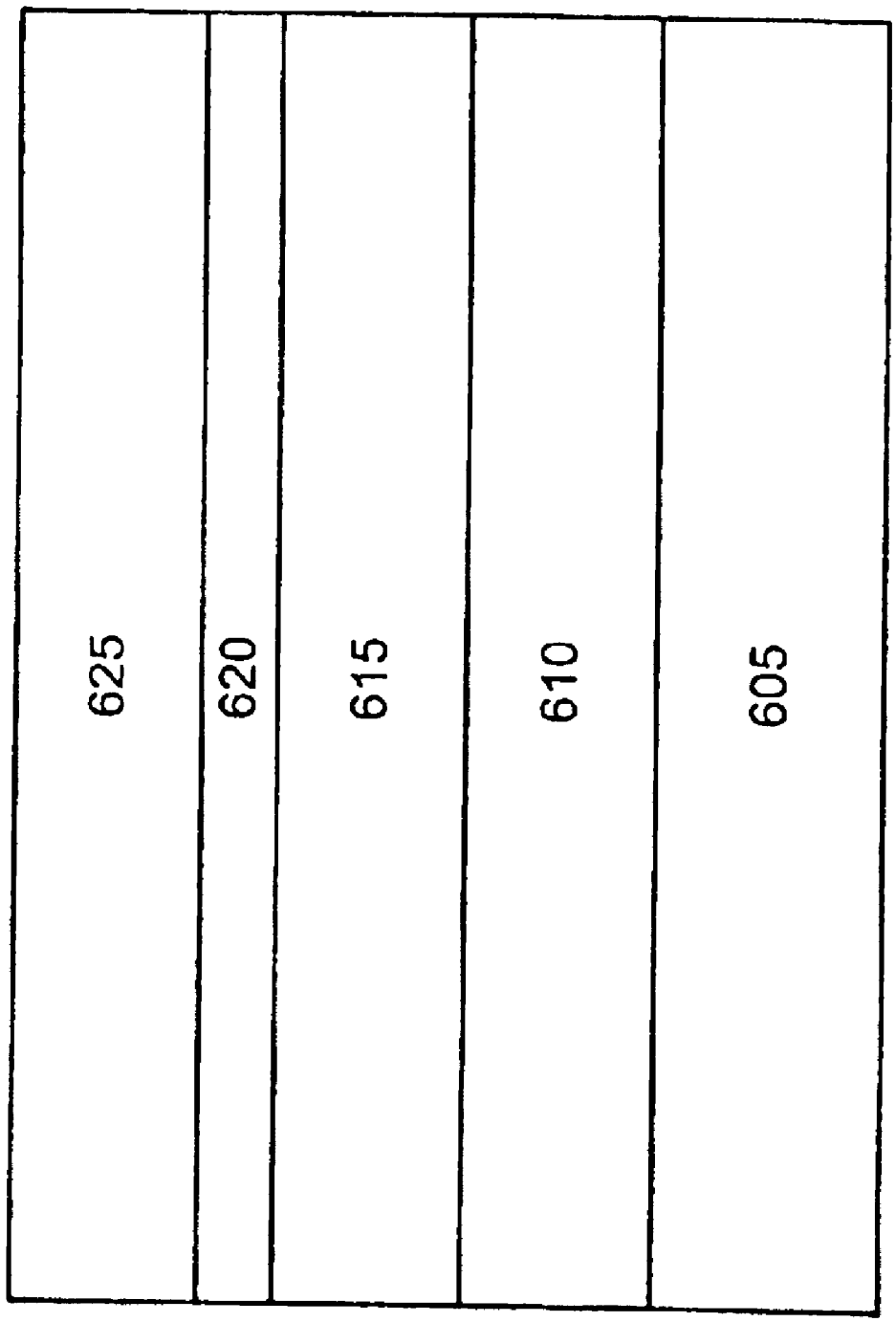

NARROW FIN FINFET

TECHNICAL FIELD

The present invention relates generally to transistors and, more particularly, to fin field effect transistors (FinFETs).

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFET's to include increasingly smaller device features. New device structures are, therefore, being explored to improve FET performance and allow further device scaling.

Double-gate MOSFETs represent structures that have been considered as candidates for succeeding existing planar MOSFETs. In double-gate MOSFETs, two gates may be used to control short channel effects. A FinFET is a recent double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide an exemplary process for forming double fins for a double-gate FinFET. The exemplary process, consistent with the invention, improves short-channel effects in the FinFET by thinning the double fins to create narrow fins using, for example, a thermal oxidation process. The exemplary double fin formation process may also, consistent with the invention, increase the device density, thus, reducing the pitch.

Additional advantages and other features of the invention will be set forth in pale in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a method of forming fins for a double-gate fin field effect transistor (FinFET). The method includes forming a second layer of semi-conducting material over a first layer of semi-conducting material and forming double caps in the second layer of semi-conducting material. The method further includes forming spacers adjacent sides of each of the double caps and forming double fins in the first layer of semi-conducting material beneath the double caps. The method also includes thinning the double fins to produce narrow double fins.

According to another aspect of the invention, a method of forming fins for a double-gate fin field effect transistor (FinFET) is provided. The method includes depositing a silicon layer over a buried oxide layer and depositing a $Si_3N_4$ layer over the silicon layer. The method further includes etching the $Si_3N_4$ layer to form double caps, wherein each of the double caps comprises a rectangular cross-section with a width ranging from about 100 Å to about 1000 Å, and depositing and etching an oxide material to form spacers adjacent sides of each of the double caps, wherein the oxide material includes SiO or $SiO_2$. The method also includes etching the silicon layer to form fins beneath each of the double caps and thermally oxidating the fins to thin the fins so as to produce narrow fins, wherein each of the narrow fins has a thickness ranging from about 50 Å to about 500 Å.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims.

Consistent with the present invention, an exemplary process for forming double fins for a double-gate FinFET is provided. The exemplary process may employ thermal oxidation for thinning the double fins to create narrow fins, thereby improving device short-channel effects.

Figure 1:
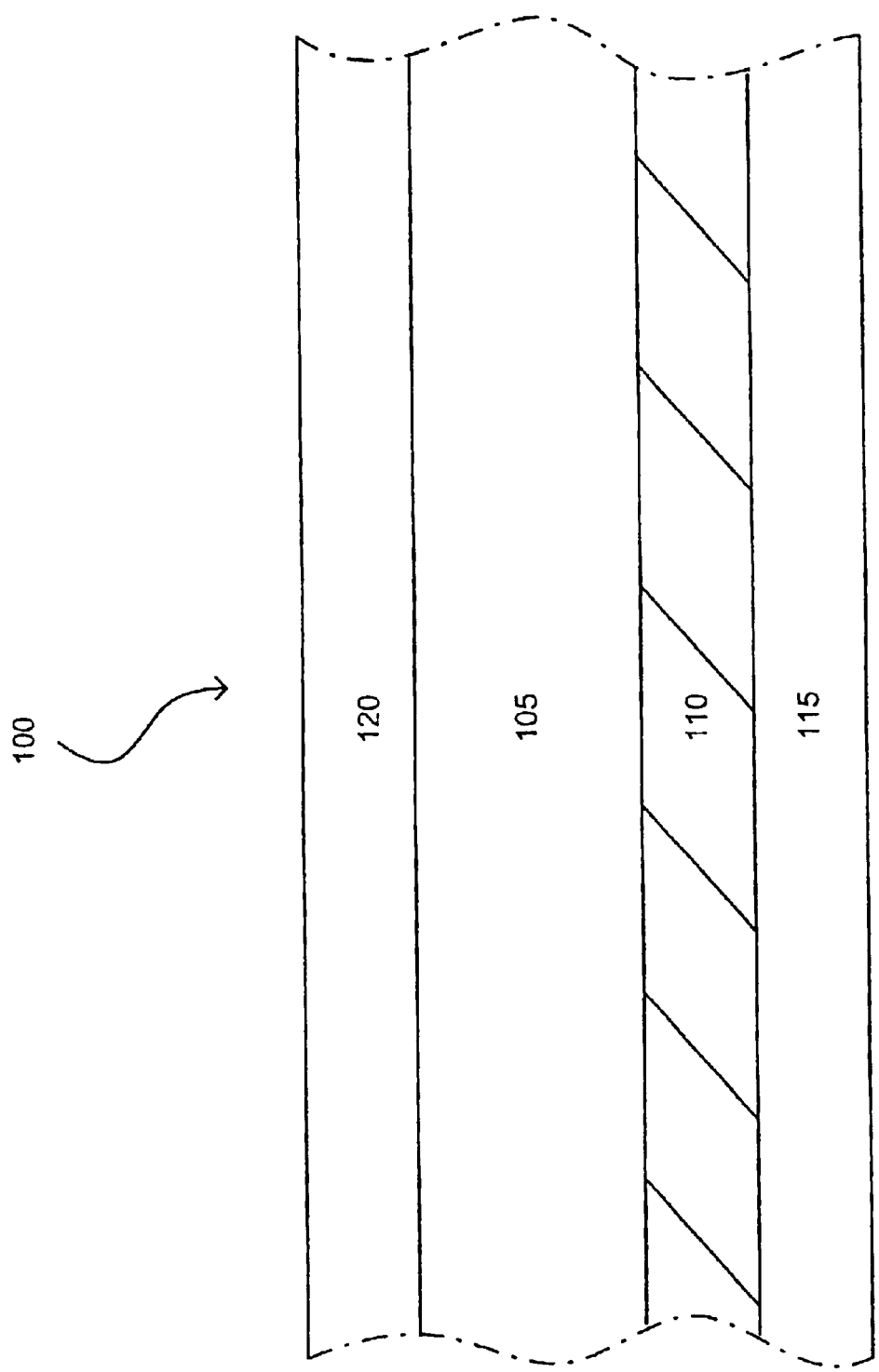
FIG. 1 illustrates exemplary layers of a silicon-on-insulator (SOI) wafer that may be used for forming a double-gate FinFET consistent with the present invention.

FIG. 1 illustrates a cross-section of a silicon on insulator (SOI) wafer 100 formed in accordance with an exemplary embodiment of the present invention. SOI wafer 100, consistent with the present invention, may include a buried oxide layer 110 formed on a substrate 115. A fin layer 105 may further be formed on buried oxide layer 110. The thickness of fin layer 105 may range, for example, from about 100 Å to about 1000 Å and the thickness of buried oxide layer 110 may range, for example, from about 1000 Å to about 3000 Å. Fin layer 105 and substrate 115 may include, for example, silicon, though other semiconducting materials, such as germanium, may be used. A layer 120 of material, such as, for example, $Si_3N_4$, may be formed on fin layer 105. Layer 120 may be deposited on fin layer 105 and may range, for example, from about 50 Å to about 500 Å in thickness.

Figure 2B:
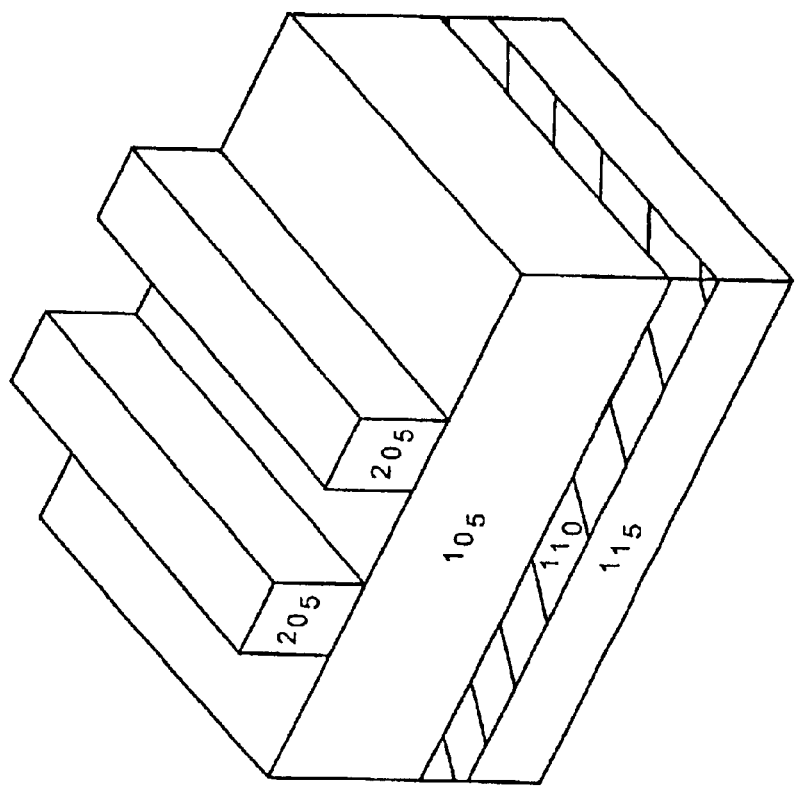
FIGS. 2A and 2B illustrate the formation of caps on the fin layer of FIG. 1 consistent with the invention.
Figure 2A:
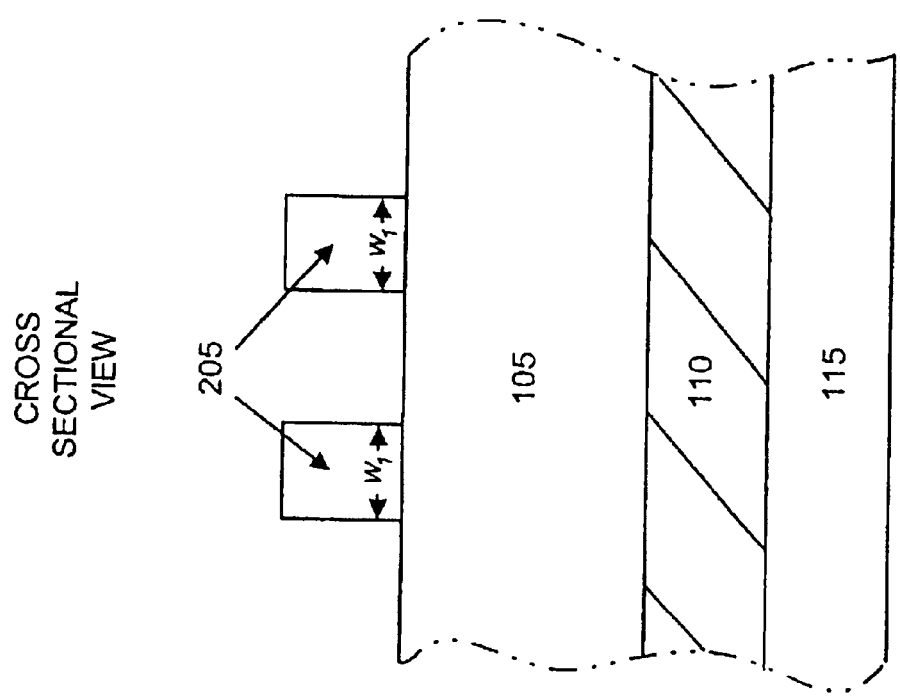
Figure 3:
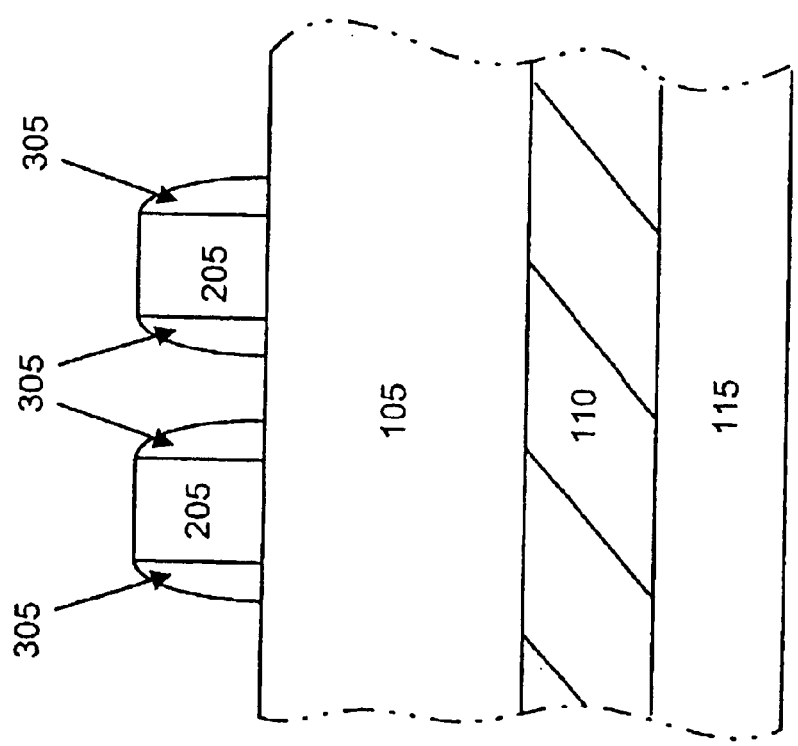
FIG. 3 illustrates the formation of spacers adjacent the caps of FIGS. 2A and 2B consistent with the invention.

As shown in FIGS. 2A and 2B, two caps 205 may be defined in layer 120. Caps 205 may be defined, for example, using conventional etching processes and may have a width $w_1$ that ranges from about 50 Å to about 500 Å. Spacers 305 may then be formed on the sides of caps 205, as shown in FIG. 3. Spacers 305 may be thermally grown, or deposited and etched, on the sides of caps 205 and may include, for example, an oxide material. The oxide material may include, for example, SiO or $SiO_2$, though other oxide materials may be used.

Figure 4:
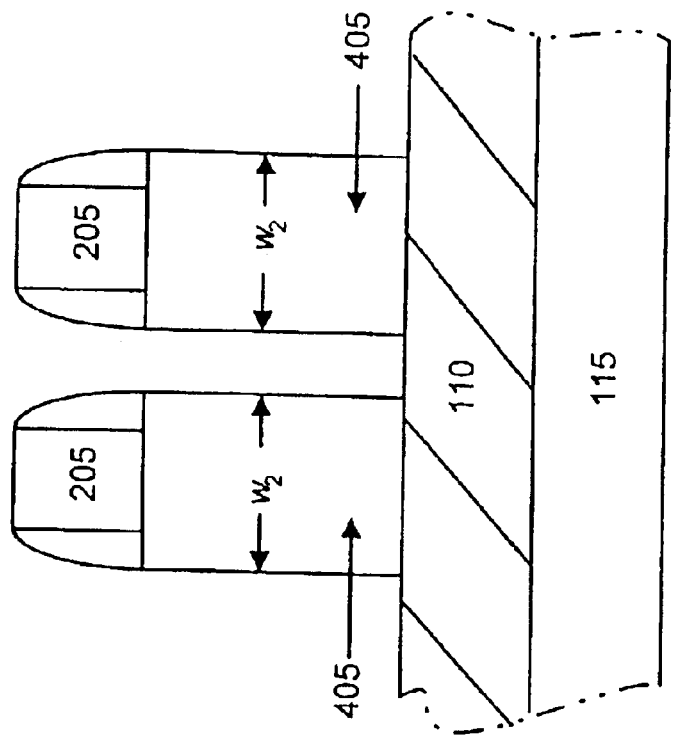
FIG. 4 illustrates the formation of double fins from the fin layer of FIG. 3 consistent with the invention.
Figure 5B:
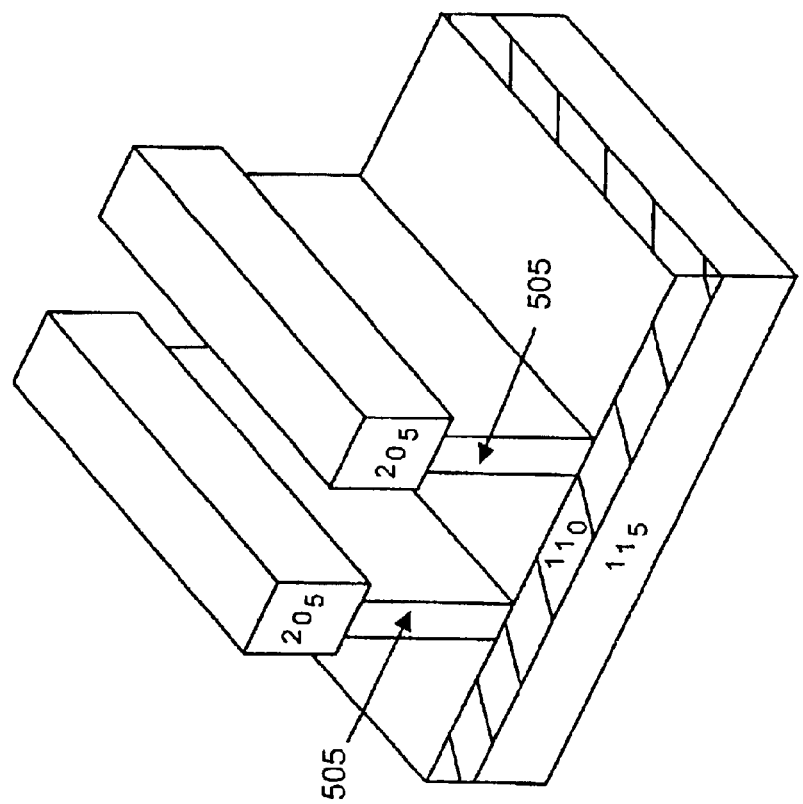
FIGS. 5A and 5B illustrate thinning of the double fins of FIG. 4 consistent with the invention.
Figure 5A:
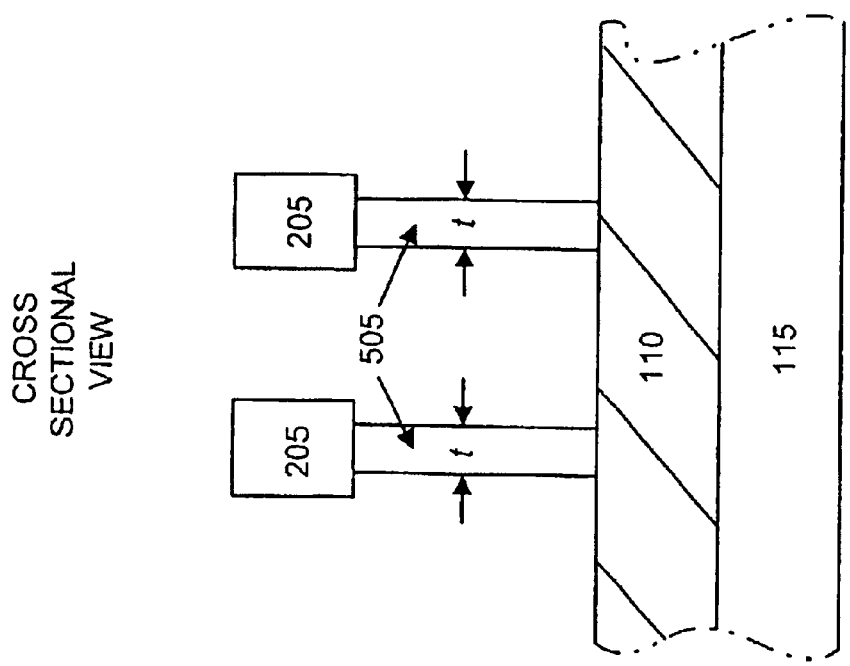

Two fins 405 may be formed from fin layer 105, as shown in FIG. 4. Fins 405 may be formed beneath spacers 305 and caps 205 using, for example, conventional etching processes. Fins 405 may include a width $w_2$ ranging from about 50 Å to about 500 Å. Thermal oxidation may then be performed and the oxide removed to thin down fins 405 to create thinned fins 505, as shown in FIGS. 5A and 5B. The thickness t of thinned fins 505 may range from about 100 Å to about 1000 Å. Oxide spacers 305 may also be removed, as further shown in FIGS. 5A and 5B, during the oxide removal. The thinning of fins 505, thereby, improves the short-channel effects in a double-gate FinFET that can result from the above-described process (with the addition of double gates that are not shown). The exemplary process described above for forming thinned fins for a double-gate FinFET additionally may increase the device density, thus, reducing the device pitch.

Exemplary Metal-Induced Crystallization for Top-Bottom Gate Double Gate FinFET

Figure 7:
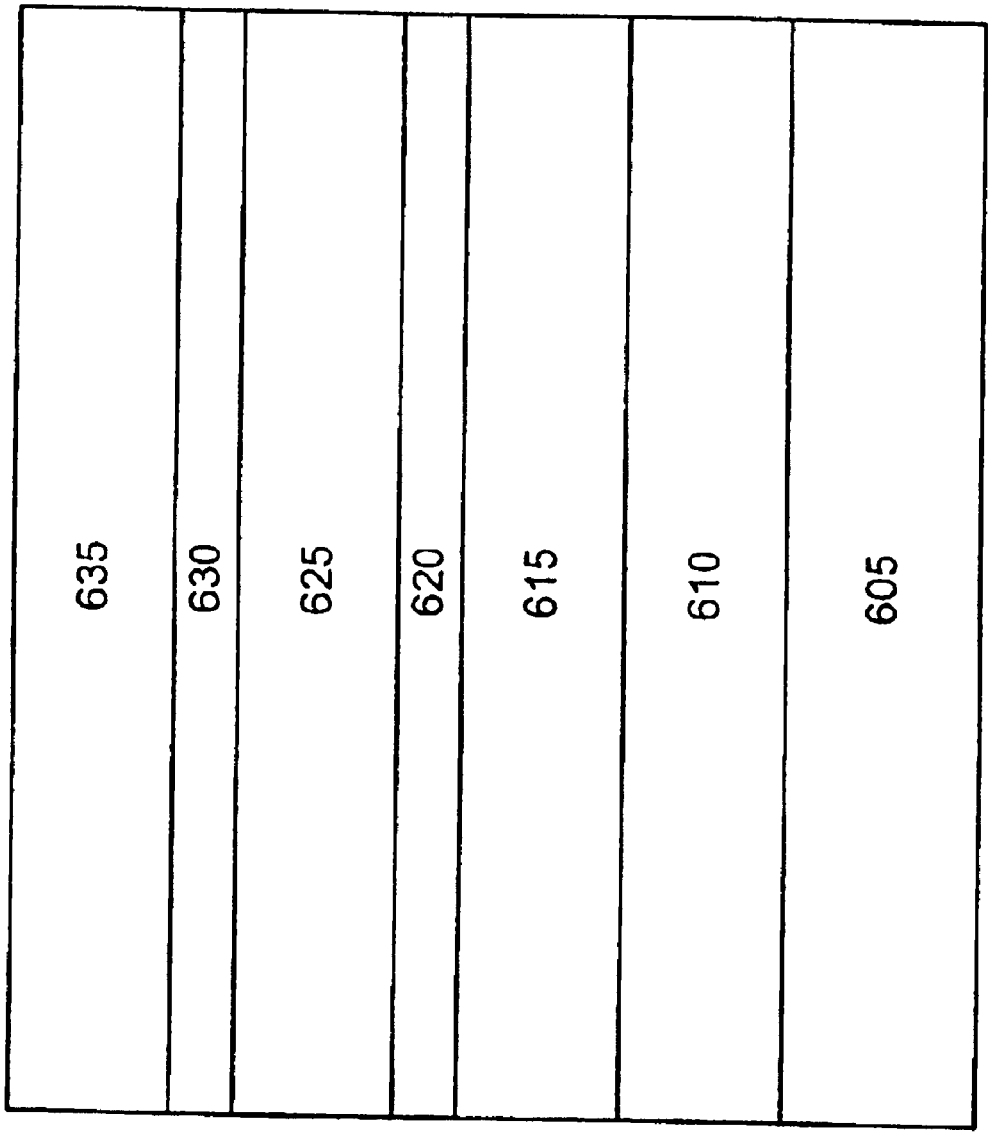
FIG. 7 illustrates the formation of another gate insulation layer and a top gate layer on the channel layer of FIG. 6 consistent with another embodiment of the invention.
Figure 6:
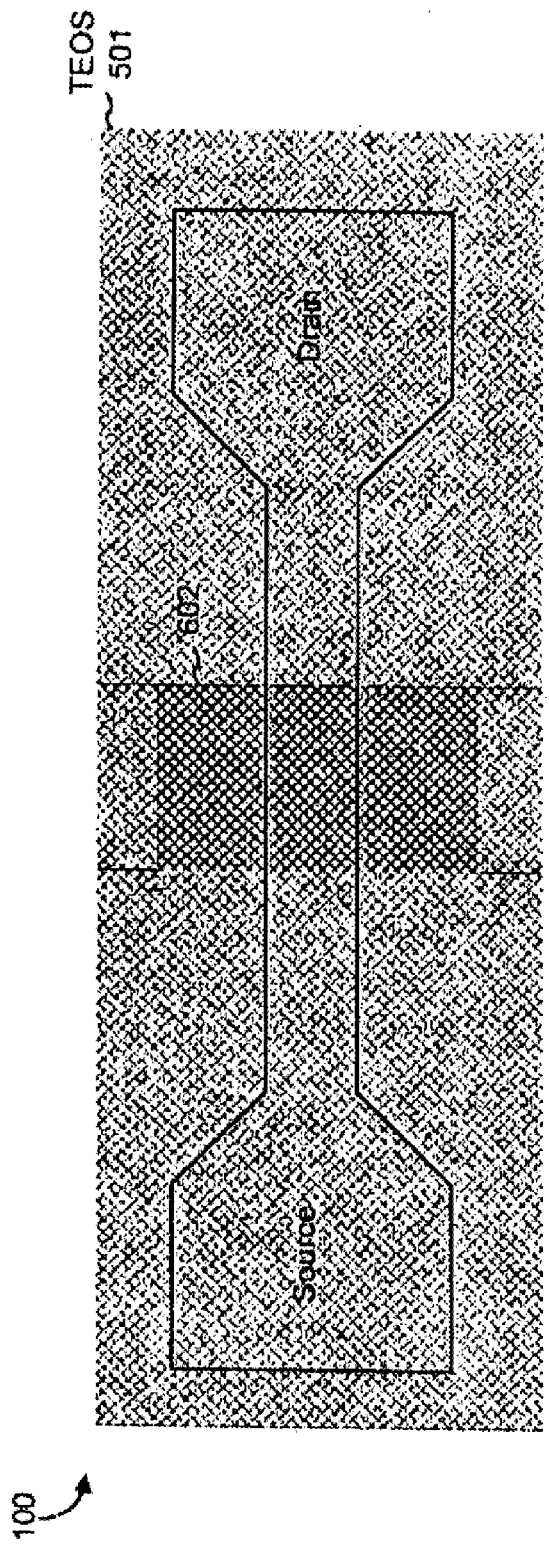
FIG. 6 illustrates the formation of a bottom gate layer, gate insulation layer and channel layer for a planar FinFET consistent with another embodiment of the invention.
Figure 7:
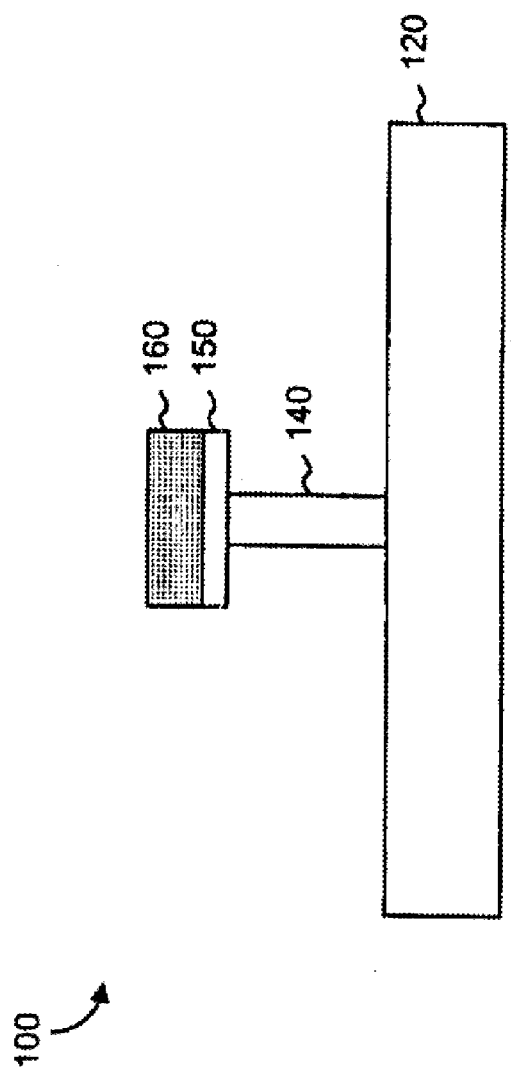

FIGS. 6–7 illustrate an exemplary process for forming a planar double-gate FinFET with top/bottom gates using metal-induced crystallization. As shown in FIG. 6, a layer 610 of oxide, for example, may be grown on a bulk wafer that includes a substrate 605. Oxide layer 610 may include, for example, SiO or $SiO_2$, though other oxide materials may be used, and may range, for example, from about 100 Å to about 500 Å in thickness. A layer 615 of material for a bottom gate may then be deposited on oxide layer 610. Layer 615 may include polysilicon or a metal material, such as, for example, TiN, W, or Mo, and may range from about 100 Å to about 500 Å in thickness. A gate insulation layer 620 may then be deposited on layer 615. Gate installation layer 620 may include SiO, $SiO_2$, SiN, SiON, $HFO_2$, $ZrO_2$, $Al_2O_3$, HfSiO(x) ZnS, $MgF_2$, or other high-K dielectric materials. The thickness of gate insulation layer 620 may range, for example, from about 10 Å to about 50 Å. A channel layer 625 may then be deposited on gate insulation layer 620. Channel layer 625 may include an amorphous silicon (α-Si) material. Channel layer 625 may additionally include a layer of deposited nickel (Ni). After deposition of the nickel layer, the channel layer 625 may be annealed to convert the amorphous silicon and Ni to crystalline silicon via metal induced crystallization.

As shown in FIG. 7, a second gate insulation layer 630 may be deposited on channel layer 625. Gate insulation layer 630 may include SiO, $SiO_2$, SiN, SiON, $HFO_2$, $ZrO_2$, $Al_2O_3$, HfSiO(x) ZnS, $MgF_2$, or other high-K dielectric materials. The thickness of gate insulation layer 630 may range, for example, from about 10 Å to about 50 Å. A layer 635 of material for a top gate may then be deposited on oxide layer gate insulation layer 630. Layer 635 may include polysilicon or a metal material, such as, for example, TiN, W, or Mo, and may range from about 100 Å to about 500 Å in thickness. The layers of material for the bottom gate and top gate may then be etched (not shown) using conventional etching processes to provide appropriate definition for the gates. Subsequent to gate definition, the resulting FinFET includes a planar double-gate device with top and bottom gates that has a channel in between the top and bottom gates created using metal-induced crystallization.

Exemplary Gate Dielectric Stresser

Figure 8B:
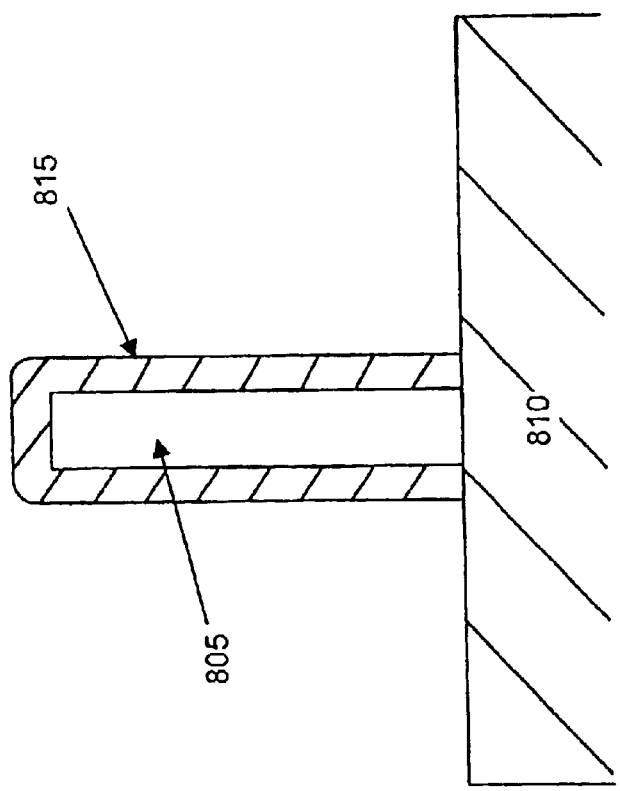
FIGS. 8A and 8B illustrate the formation of a selected dielectric layer on a FinFET fin to induce strain within the FinFET channel consistent with yet another embodiment of the invention.
Figure 8A:
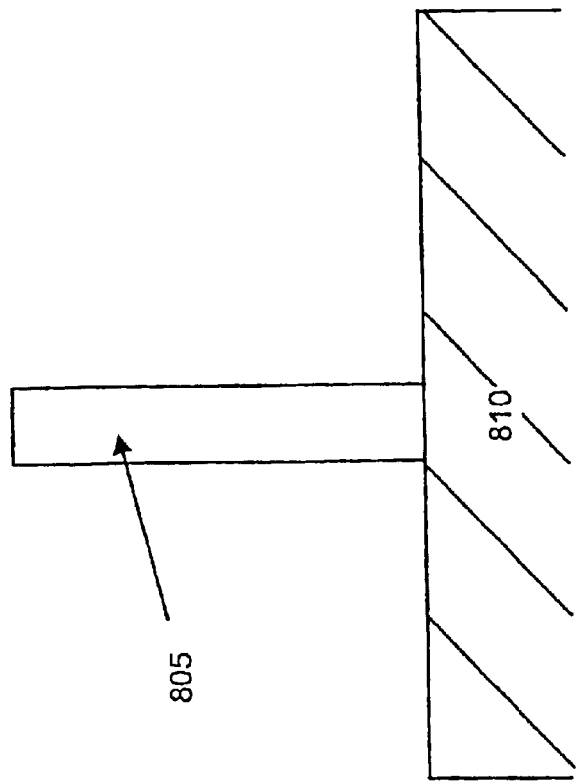
Figure 1:
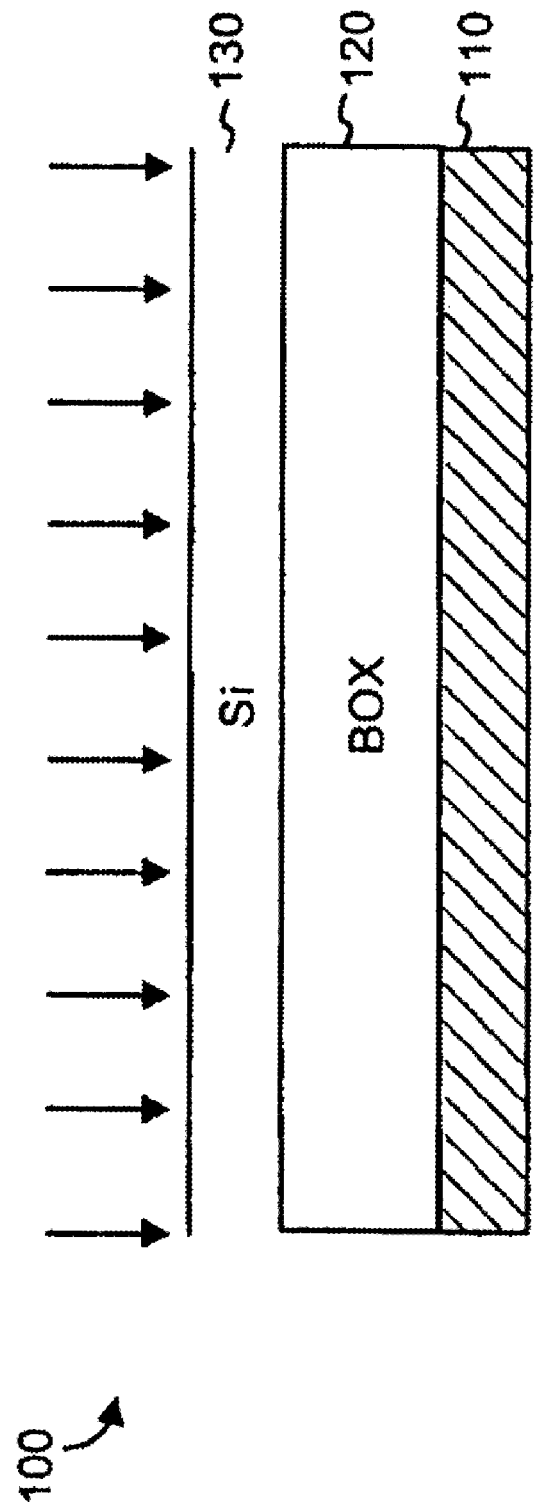
Figure 3:
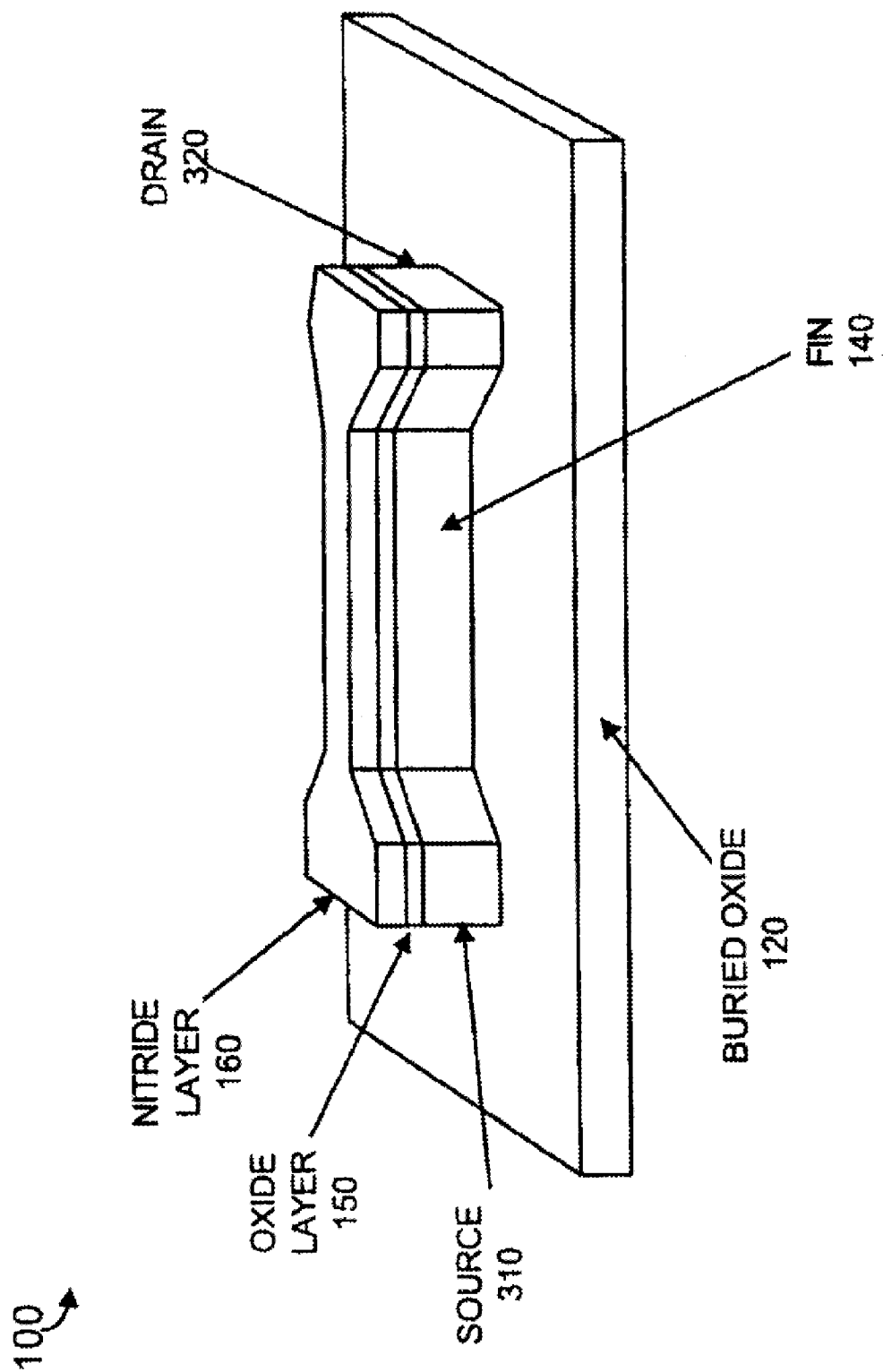
Figure 4:
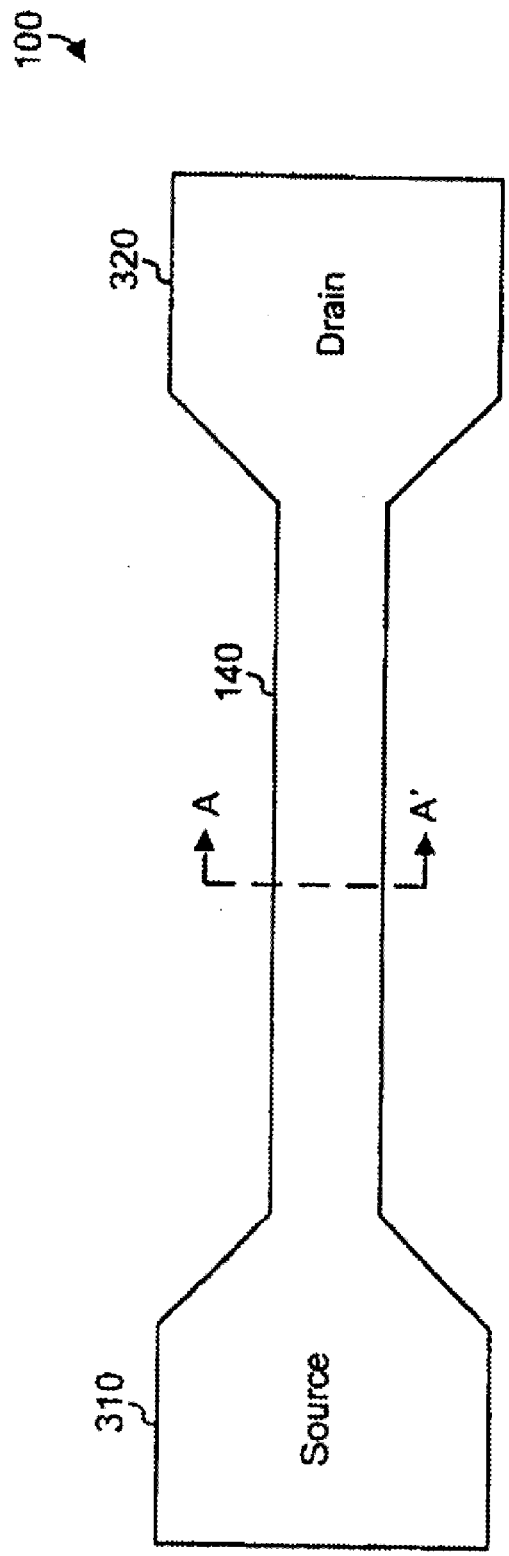

FIGS. 8A and 8B illustrate an exemplary FinFET gate dielectric, consistent with another embodiment of the invention, that improves FinFET carrier mobility. As shown, a fin 805 may be formed on a substrate 810, using any conventional technique, and a dielectric layer 815 may be thermally grown or deposited on the fin 805. The dielectric material of dielectric layer 815 may be chosen such that a desirable stress condition (i.e., due to tensile strain) may be created in fin 805, which represents the channel region of the FinFET. The dielectric material, such as a high dielectric constant dielectric material, may be appropriately selected to create tensile strain in the material that comprises fin 805. The induced tensile strain improves carrier mobility of the channel region, thus, improving FinFET performance.

In previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic, etching and deposition techniques may be employed, and hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A MOSFET device comprising:

a source and a drain structure formed on an insulating layer;

a fin structure formed on the insulating layer between the source and the drain, the fin structure including a thinned region formed in a channel area of the fin structure;

a protective layer formed over at least the thinned region of the fin structure, the protective layer having a wider width than a width of the thinned region;

a dielectric layer formed around at least a channel portion of the fin structure; and a gate formed on the insulating layer around the dielectric layer and the fin structure.

2. The device of claim 1, wherein the thinned region has a width of about 3 to 6 nm.

3. The device of claim 1, wherein the protective layer includes:

a. an oxide layer, and a nitride layer formed over the oxide layer.

4. The device of claim 3, wherein the oxide layer is deposited to a depth of about 15 nm and the nitride layer is deposited to a depth of about 50 nm to 75 nm.

5. The device of claim 1, wherein the dielectric layer is about 0.6 nm to 1.2 nm thick.

6. The device of claim 1, wherein the gate comprises polysilicon.

7. The device of claim 1, wherein the MOSFET device is a FinFET.

8. The device of claim 1, wherein the gate is formed to include small gate lengths.

9. A method for forming a MOSFET device comprising:

forming a source, a drain, and a fin structure on an insulating layer, portions of the fin structure acting as a channel for the MOSFET;

forming a protective layer above the fin structure;

trimming the fin structure to a width of about 3 nm to 6 nm without significantly trimming the protective layer;

forming a dielectric layer around the fin structure; and depositing a polysilicon layer around the dielectric layer, the polysilicon layer acting as a gate area for the MOSFET.

10. The method of claim 9, wherein the fin structure is trimmed by exposing the fin structure to $NH_4OH$.

11. The method of claim 9, wherein forming the protective layer includes:

depositing an oxide layer to a depth of about 15 nm, and depositing a nitride layer to a depth of about 50 nm to 75 nm.

12. The method of claim 9, further comprising:

depositing a TEOS (tetmethylorthosilicate) protective layer over the MOSFET device before trimming the fin structure.

13. The method of claim 12, further comprising:

etching away the TEOS protective layer over the fin structure before trimming the fin structure.

14. The method of claim 12, further comprising:

depositing the polysilicon layer to a depth of 50 nm to 70 nm on the TEOS protective layer.

* * * * *

UNITED STATES PATENT AND TRADEMARK OFFICE
CERTIFICATE OF CORRECTION

PATENT NO. : 6,762,483 B1
APPLICATION NO. : 10/348910
DATED : July 13, 2004
INVENTOR(S) : Krivokapic et al.

It is certified that error appears in the above-identified patent and that said Letters Patent is hereby corrected as shown below:

Please delete Title Page and insert the Title Page as attached.

The Title Page showing and illustrative figure, should be deleted and substitute therefor the attached Title Page.

Delete Drawing Sheets 1-7 and substitute therefor the Drawings Sheets, consisting of Figs 1-18, as shown on the attached pages.

Please delete the entire patent Columns 1 line 1 through Columns 6 line 24 and insert Columns 1 line 1 through Columns 8 line 6 as attached.

Signed and Sealed this

Twenty-fifth Day of March, 2008

JON W. DUDAS
*Director of the United States Patent and Trademark Office*

(12) United States Patent
Krivokapic et al.

(10) Patent No.: US 6,762,483 B1
(45) Date of Patent: Jul. 13, 2004

(54) NARROW FIN FINFET

(75) Inventors: Zoran Krivokapic, Santa Clara, CA (US); Judy Xilin An, San Jose, CA (US); Srikanteswara Dakshina-Murthy, Austin, TX (US); Haihong Wang, Fremont, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/348,910

(22) Filed: Jan. 23, 2003

(51) Int. Cl.[7] .................................. H01L 29/06
(52) U.S. Cl. .................... 257/618; 257/327; 257/347
(58) Field of Search ...................... 257/618, 327, 347

(56) References Cited

U.S. PATENT DOCUMENTS

| | | |
|---|---|---|
| 6,583,469 B1 * | 6/2003 | Fried et al. ............... 257/329 |
| 2003/0042531 A1 * | 3/2003 | Lee et al. ................. 257/315 |
| 2004/0048424 A1 * | 3/2004 | Wu et al. ................. 438/154 |

OTHER PUBLICATIONS

Copy of U.S. Appl. No. 10/699,887; filed Nov. 4, 2003; entitled: "Self Aligned Damascene Gate"; 35 pages.

Digh Hisamoto et al.: "FinFET—A Self-Aligned Double-Gate MOSFET Scalable to 20nm," IEEE Transactions on Electron Devices, vol. 47, No. 12, Dec. 2000, pp. 2320–2325.

Yang-Kyu Choi et al.: "Sub-20nm CMOS Fin FET Technologies," 0-7803-5410-9/99 IEEE, Mar. 2001, 4 pages.

Xuejue Huang et al.: "Sub-50 nm P-Channel Fin FET," IEEE Transactions on Electron Devices, vol. 48, No. 5, May 2001, pp. 880–886.

Yang-Kyu Choi et al.: "Nanoscale CMOS Spacer FinFET for the Terabit Era," IEEE Electron Device Letters, vol. 23, No. 1, Jan. 2002, pp. 25–27.

Xuejue Huang et al.: "Sub 50-nm FinFET: PMOS," 0-7803-7050-3/01 IEEE, Sep. 1999 4 pages.

Co-pending U.S. Appl. No. 10/614,052, filed Jul. 8, 2003 entitled: "Narrow Fins By Oxidation In Double-Gate FinFET," 11 page specification, 7 sheets of drawings.

* cited by examiner

*Primary Examiner*—David Nelms
*Assistant Examiner*—Tu-Tu Ho
(74) *Attorney, Agent, or Firm*—Harrity & Snyder LLP

(57) ABSTRACT

A narrow channel FinFET is described herein with a channel width of less than 6 nm. The FinFET may include a fin in which the channel area is trimmed using a $NH_4OH$ etch or a reactive ion etch (RIE).

14 Claims, 13 Drawing Sheets

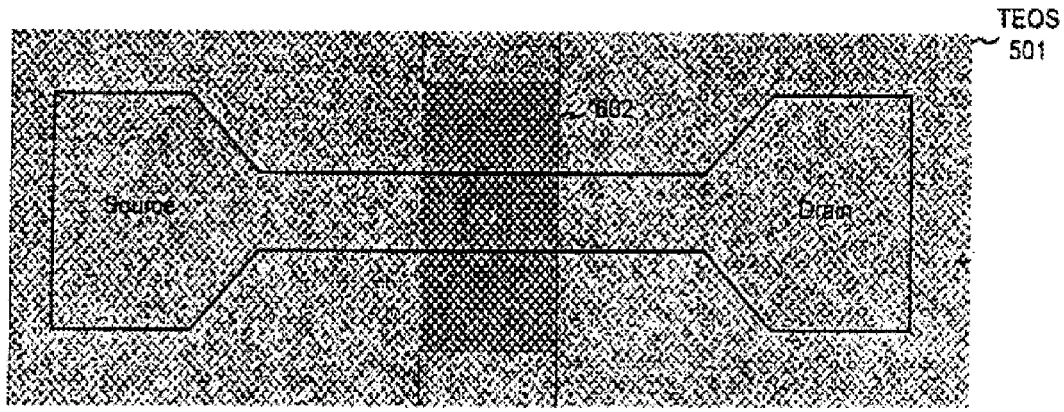

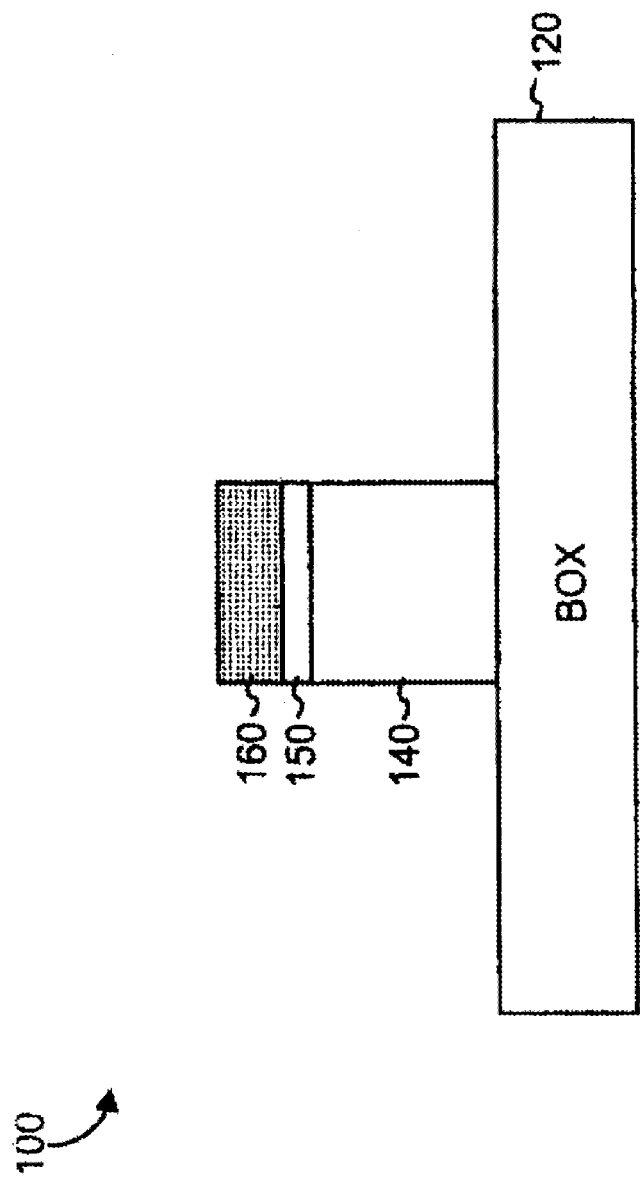

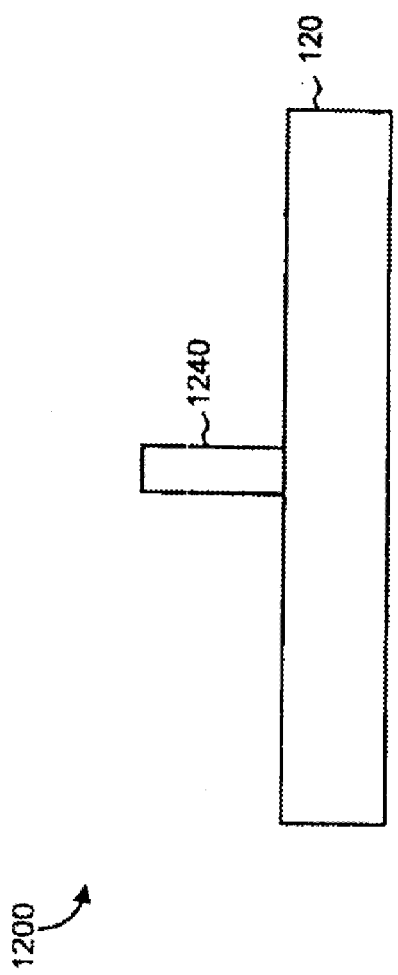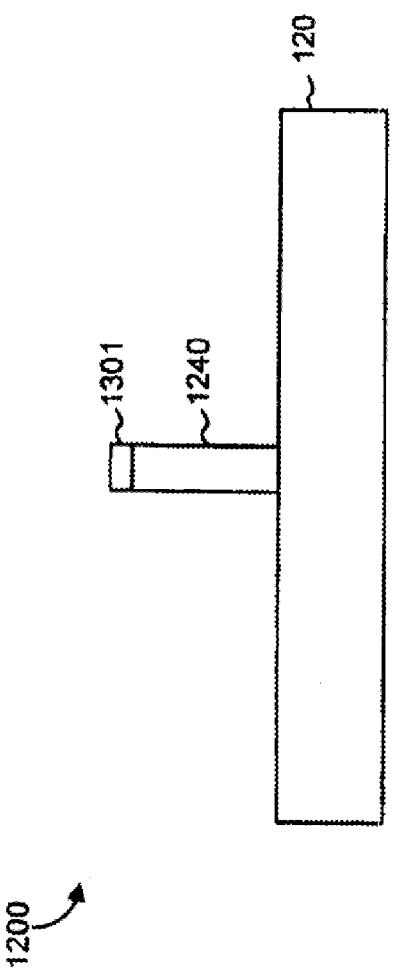

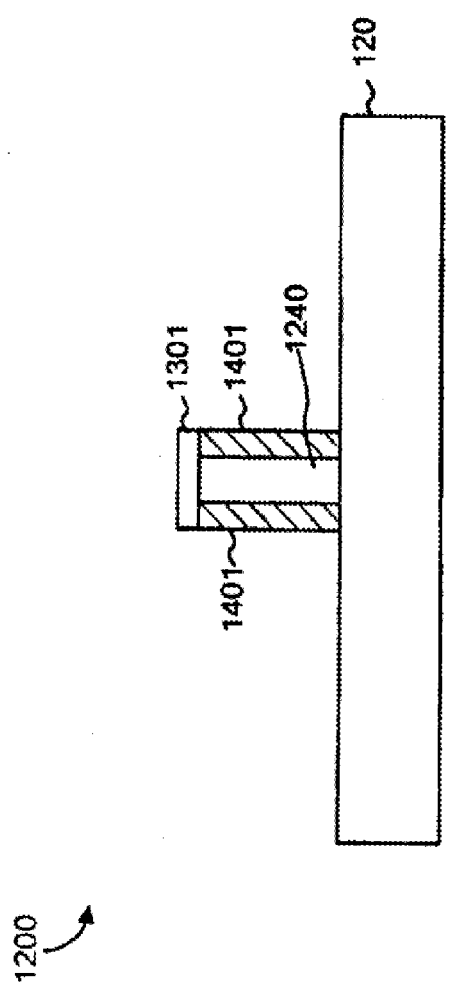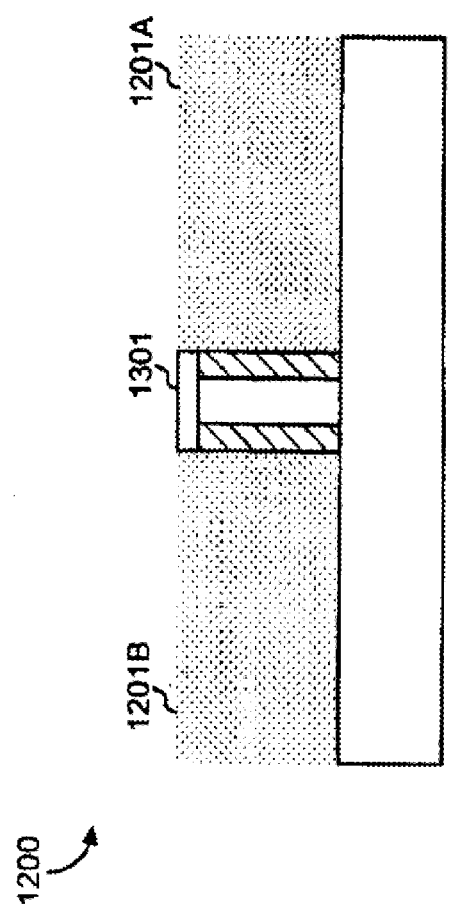

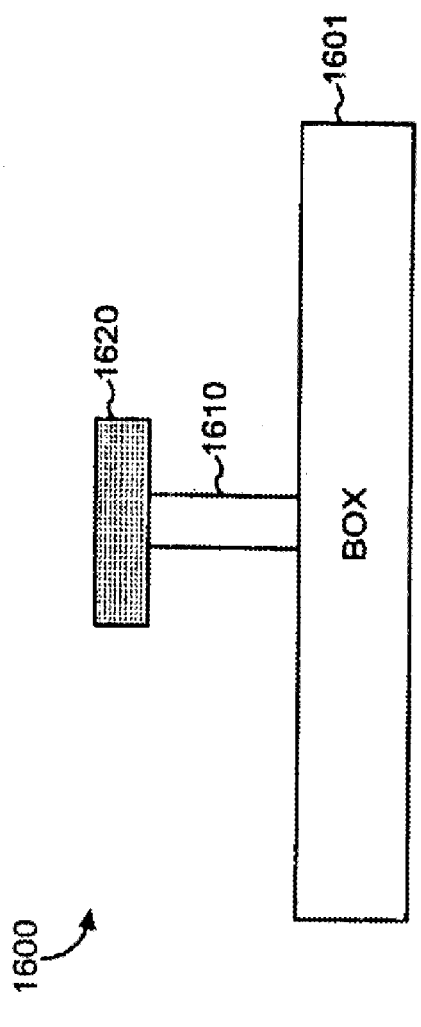
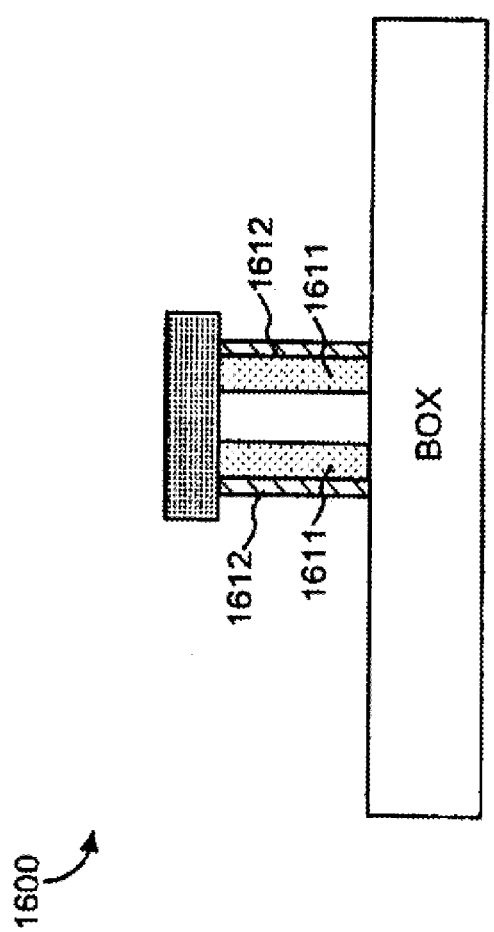

NARROW FIN FINFET

BACKGROUND OF THE INVENTION

A. Field of the Invention

The present invention relates generally to semiconductor devices and methods of manufacturing semiconductor devices and, more particularly, to double-gate metal oxide semiconductor field-effect transistors (MOSFETs).

B. Description of Related Art

Transistors, such as MOSFETs, are the core building block of the vast majority of semiconductor devices. Some semiconductor devices, such as high performance processors, can include millions of transistors. For these devices, decreasing transistor size, and thus increasing transistor density, has traditionally been a high priority in the semiconductor manufacturing area.

Conventional MOSFETs have difficulty scaling below 50 nm fabrication processing. To develop sub-50 nm MOSFETs, double-gate MOSFETs have been proposed. In several respects, double-gate MOSFETs offer better characteristics than the conventional bulk silicon MOSFETs. These improvements arise because the double-gate MOSFET has a gate electrode on both sides of the channel, rather than only on one side as in conventional MOSFETs.

SUMMARY OF THE INVENTION

Implementations consistent with the present invention provide a double-gate MOSFET having a thin channel area and methods of manufacturing the same.

One aspect of the invention is directed to a MOSFET device that includes a source and a drain structure formed on an insulating layer. A fin structure is formed on the insulating layer between the source and the drain. The fin structure includes a thinned region formed from a channel area of the fin structure. A protective layer is formed over at least the thinned region of the fin structure. The protective layer has a wider width than a width of the thinned region. A dielectric layer is formed around at least a portion of the fin structure and a gate is formed around the dielectric layer and the fin structure.

Another aspect of the of the invention is directed to a method for forming a MOSFET device. The method includes forming a source, a drain, and a fin structure on an insulating layer. Portions of the fin structure act as a channel for the MOSFET. The method further includes forming a protective layer above the fin structure and trimming the fin structure to a width of about 3 nm to 6 nm without significantly trimming the protective layer. The method further includes growing a dielectric layer around the fin structure and depositing a polysilicon layer around the dielectric layer. The polysilicon layer acts as a gate area for the MOSFET.

BRIEF DESCRIPTION OF THE DRAWINGS

Reference is made to the attached drawings, wherein elements having the same reference number designation may represent like elements throughout.

Figure 5:
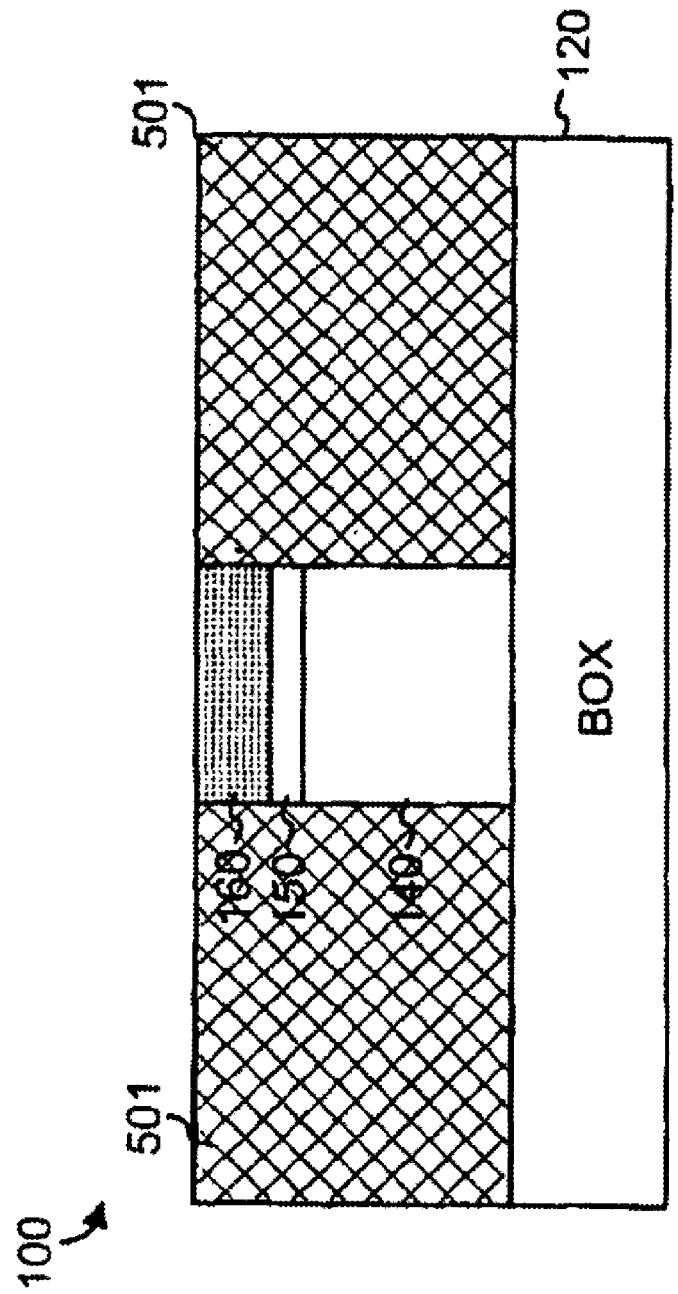
Figure 8:
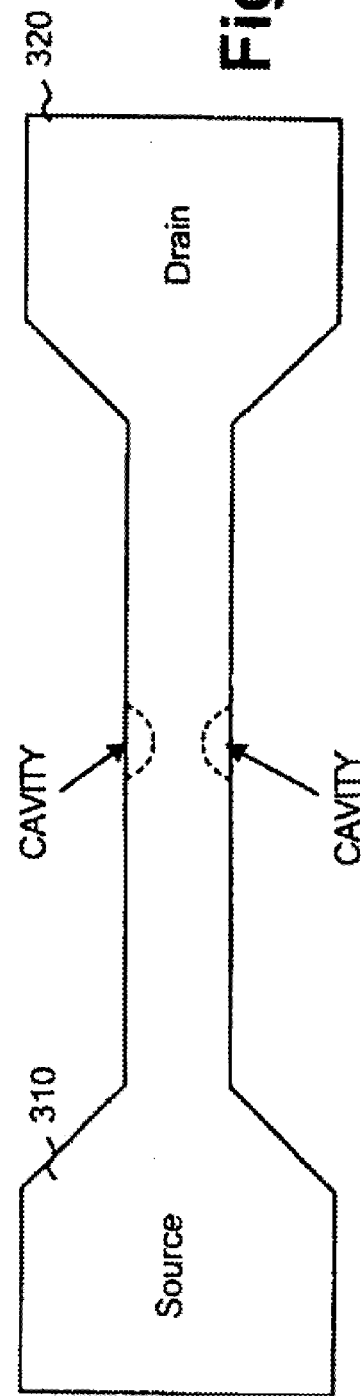
Figure 9:
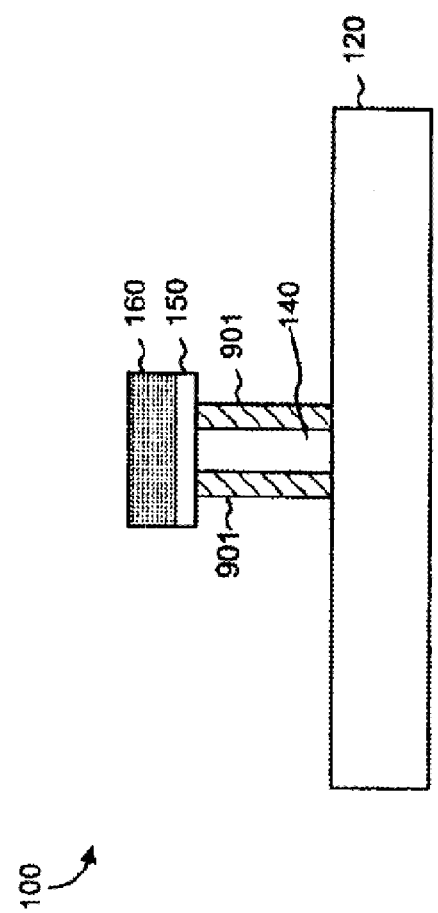
Figure 10:
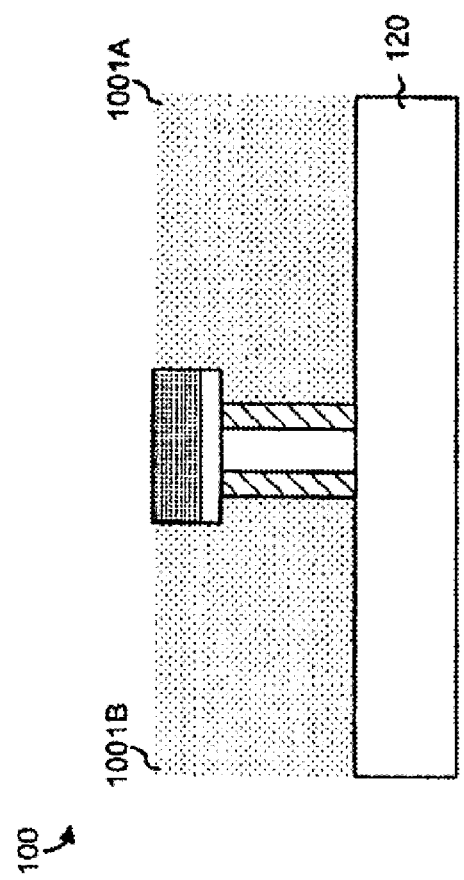
Figure 11:
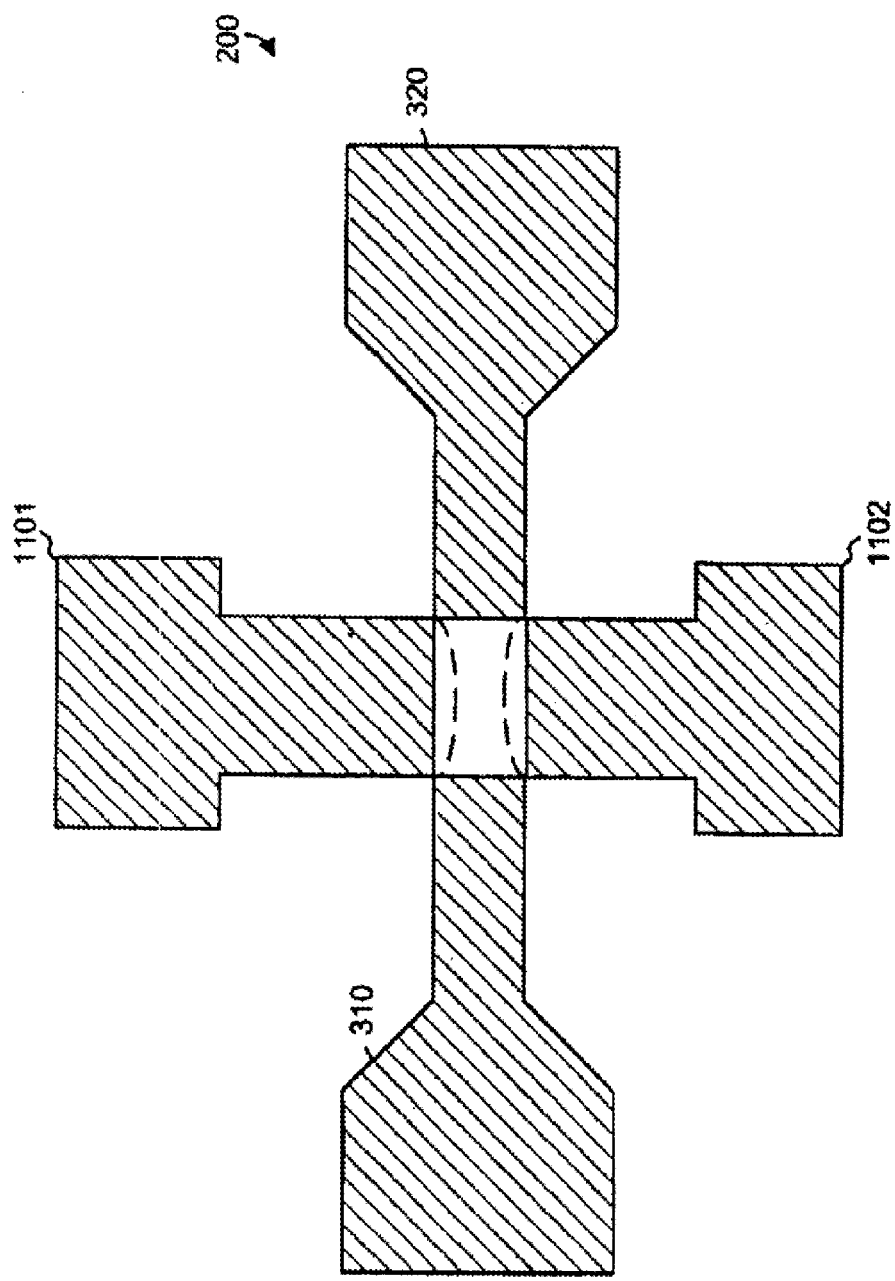
Figure 18:
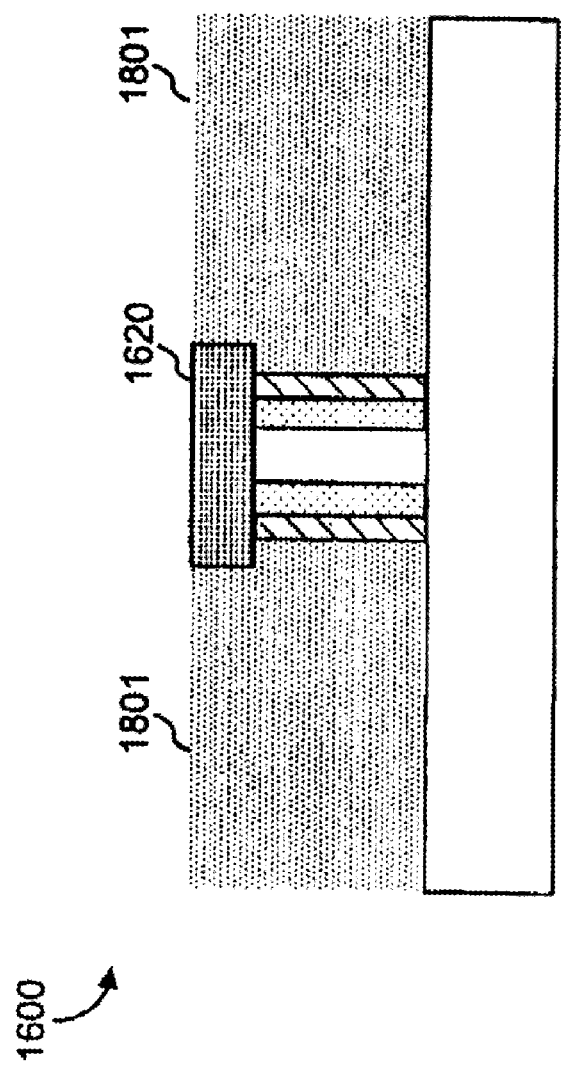

FIGS. 1 and 2 are cross-section views illustrating formation of a FinFET consistent with aspects of the invention;

FIG. 3 is a perspective view of the FinFET shown in FIG. 2;

FIG. 4 is a top view of the FinFET shown in FIG. 3;

FIG. 5 is a cross-section view taken along the line A-A' in FIG. 4;

FIG. 6 is a top view of the FinFET shown in FIG. 3;

FIG. 7 is a cross-section view taken along the line A-A' in FIG. 4;

FIG. 8 is a top view of the FinFET shown in FIG. 7;

FIGS. 9 and 10 are cross-section views of the FinFET;

FIG. 11 is a top view of a complete FinFET;

FIGS. 12-15 are cross-section views of a FinFET consistent with a second embodiment of the invention; and FIGS. 16-18 are cross-section views of a double-gate FinFET built around an SiGe layer.

BEST MODE FOR CARRYING OUT THE INVENTION

The following detailed description of the invention refers to the accompanying drawings. The same reference numbers may be used in different drawings to identify the same or similar elements. Also, the following detailed description does not limit the invention. Instead, the scope of the invention is defined by the appended claims and equivalents.

A FinFET, as the term is used herein, refers to a type of MOSFET in which a conducting channel is formed in a vertical Si "fin." FinFETs are generally known in the art.

FIG. 1 is a cross-section illustrating doping of a starting structure for a FinFET 100. FinFET 100 may include a silicon-on-insulation (SOI) structure that includes buried oxide (BOX) layer 120 formed on a silicon and/or germanium substrate 110, with a silicon layer 130 over BOX layer 120. Alternatively, layer 130 may comprise germanium or silicon-germanium. In an exemplary implementation, BOX layer 120 may have a thickness ranging from about 200 nm to about 400 nm and silicon layer 130 may have a thickness ranging from about 30 nm to about 100 nm. A protective layer, such as an oxide layer (e.g., $SiO_2$) and/or a nitride layer (e.g., $Si_3N_4$) may next be deposited to act as a protective cap during subsequent etching.

The silicon layer 130 and protective layers may then be etched to form a silicon fin 140 with protective layers 150 and 160 over top of fin 140 (see FIG. 2). Protective layer 150 may be an oxide layer and protective layer 160 may be a nitride layer. Layer 150 may have a thickness of, for example, approximately 15 nm and layer 160 may have a thickness ranging from about 50-75 nm.

Source/drain regions may then be formed adjacent the ends of fin 140. In one implementation, silicon layer 130 may be patterned and etched to form source and drain regions simultaneously with fin 140. In other implementations, another layer of silicon may be deposited and etched in a conventional manner to form source and drain regions. FIG. 3 is a perspective view of FinFET 100 with source and drain regions 310 and 320 formed adjacent the ends of fin 140.

FIG. 4 is a schematic top-level view of FinFET 100 with source region 310, drain region 320, and fin 140. The cross-sectional views in FIGS. 1 and 2 are taken along the line A-A' in FIG. 4.

A TEOS (tetraethylorthosilicate) layer 501 may next be deposited over FinFET 100. FIG. 5 is a cross-sectional-view of FinFET 100, taken along the line A-A' in FIG. 4, illustrating TEOS layer 501. The TEOS layer 501 may be annealed and planarized to produce a relatively flat surface across the top of FinFET 100.

A damascene gate mask may be defined and patterned in TEOS 501. In particular, a trench may be formed in TEOS 501. The gate area may then be opened in TEOS 501 via etching. FIG. 6 is a diagram illustrating a top-level view of FinFET 100 in which area 602 in TEOS 501 is illustrated as the opened portion. More particularly the mask may be used to allow the TEOS in area 602 to be etched while maintaining the remaining TEOS 501. In one implementation, patterning the gate area to obtain small gate lengths may be performed by depositing a polysilicon layer to a depth of about 50 to 70 nm on the TEOS in area 602. This polysilicon layer may be patterned, leaving very thin polysilicon lines. A layer of oxide may then be deposited to about 120 to 150 nm and then polished back to the top of the polysilicon. Next, the polysilicon is etched away. The TEOS in area 602 is then etched, using the remaining oxide layer as a mask for the TEOS etch.

Fin 140 may next be thinned. In one embodiment, fin 140 may be thinned by exposing FinFET 100 to $NH_4OH$ until fin 140 is reduced from a width of 10 nm to 15 nm to a width of approximately 3 nm to 6 nm. This thinning process may be performed at a relatively slow and controlled pace such that the fin is trimmed at a rate of approximately 2 Å/min. A fin that is thinned in this manner is illustrated in FIG. 7, which is a cross-sectional view taken along the line A-A' in FIG. 4. FIG. 8 is a corresponding top-view of FIG. 7. As shown in FIGS. 7 and 8, FinFET 100, after thinning of fin 140, includes a cavity, formed beneath oxide layer 150 and nitride layer 160.

A gate dielectric layer 901 may be grown on the side surfaces of fin 140 as illustrated in FIG. 9. Gate dielectric layer 901 may be as thin as 0.6 to 1.2 nm. Alternatively, a high-k layer with an equivalent oxide thickness (EOT) of 0.6 to 1.2 nm may be formed on the side surfaces of fin 140.

Referring to FIG. 10, a layer of polysilicon may next be deposited on FinFET 100 in a conventional manner. The layer of polysilicon may be doped using gate doping masks. NMOS devices may be doped with phosphorous and PMOS devices may be doped with boron. The polysilicon may be planarized to the level of nitride layer 160, forming two separate polysilicon areas 1001A and 1001B. The polysilicon areas 1001A and 1001B may be patterned and etched to form the gates of FinFET 100. Polysilicon areas 1001A and 1001B may thus form two electrically independent gates. In other implementations, polysilicon areas 1001A and 1001B may not be polished to the level of $Si_3N_4$ layer 160. Instead, a single polysilicon layer may cover $Si_3N_4$ layer 160. In this situation, the polysilicon layer forms a single addressable gate for FinFET 100.

A mask may next be applied to the gate area 602. Using the mask to protect the gate area 602, the TEOS layer 501 and protective $SiO_2$ and $Si_3N_4$ layers 150 and 160 deposited over the source/drain region 310 and 320, may then be etched using an isotropic wet etch to remove the TEOS layer 501.

After the surface of the source/drain regions 310 and 320 are exposed, ion implantation may be performed on FinFET 100. To dope the source 310 and drain 320. More specifically, for an NMOS FinFET, phosphorous may be implanted at a dosage of $10^{15}$ atoms/cm$^2$ at 5-10 keV. For a PMOS FinFET, boron may be implanted at a dosage of $10^{15}$ atoms/cm$^2$ at 2-5 keV.

After ion implantation, salicidation (i.e., a self-aligned silicide process) may be performed on FinFET 100. In this act, a metal, such as tungsten, cobalt, titanium, tantalum, molybdenum, nickel, erbium, or platinum may be deposited over the polysilicon (gate) area 1001A and 1001B and source and drain regions 310 and 320. A thermal annealing may then be performed to create a metal-silicide compound.

FIG. 11 illustrates a top-view of FinFET 100 after the annealing. Referring to FIG. 11, the cross-hatching represents the metal-silicide compound over source/drain regions 310 and 320 and the two gate regions. The gate regions may include gate pads 1101 and 1102 formed at the end of polysilicon areas 1001A and 1001B. The resulting FinFET 100 includes a thin fin channel area 140, as indicated by the dotted lines in FIG. 11. The protective layers 150 and 160, however, are wider than fin 140, as illustrated in FIG. 10. Advantageously, the resulting thin channel MOSFETs provides improved short channel control.

Referring back to FIG. 5, in an alternate embodiment, instead of thinning fin 140 by exposing it to $NH_4OH$, fin 140 may be trimmed through a reactive ion etching (RIE) process. In general, and as is known in the art, RIE is a variation of plasma etching in which during the etching, the semiconductor wafer is placed on an RF powered electrode. In this embodiment, the fin 140 may initially be thinned by RIE to reduce the width of fin 140 to a width of approximately 3 nm to 6 nm.

Protective layers 150 and 160 may next be removed through an etch process to expose the fin, labeled as fin 1240 in FIG. 12.

To remove etch damage caused by the etching of layers 150 and 160, a sacrificial oxidation layer 1301 may next be formed on the exposed surfaces of fin 1240, as illustrated in FIG. 13. Sacrificial oxide layer may be grown or formed to a thickness of about 0.6 nm to 1.2 nm and may also function as a gate dielectric layer. Alternatively, an additional oxide layer or high-k layer with an equivalent oxide thickness (EOT) of 0.6 to 1.2 nm may be formed on the side surfaces of fin 140, labeled as layers 1401.

Referring to FIG. 15, a layer of polysilicon may next be deposited on FinFET 1200 in a conventional manner. The polysilicon may be planarized to the level of oxide layer 1301, forming two separate polysilicon areas 1201A and 1201B. The polysilicon areas 1201A and 1201B may form the gates of FinFET 1200. Polysilicon areas 1201A and 1201B may thus form two electrically independent gates. In other implementations, polysilicon areas 1201A and 1201B may not be polished to the level of oxide layer 1301. Instead, a single polysilicon layer may cover oxide layer 1301. In this situation, the polysilicon layer forms a single addressable gate for FinFET 1200.

A mask may next be applied to the gate area of FinFET 1200. With the mask to protect the gate area, TEOS layer 501 and the additional protective layers deposited over the source/drain region 310 and 320 may then be etched away from the rest of the FinFET 1200.

After the surface of the source/drain regions 310 and 320 are exposed, ion implantation may be performed on FinFET 1200. This effectively dopes the source 310 and drain 320. More specifically, for an NMOS FinFET, phosphorous may be implanted at a dosage of $10^{15}$ atoms/cm$^2$ at 5-10 keV. For a PMOS FinFET, boron may be implanted at a dosage of $10^{15}$ atoms/cm$^2$ at 2-5 keV.

After ion implantation, salicidation (i.e., a self-aligned silicide process) may be performed on FinFET 1200. In this act, a metal, such as tungsten, cobalt, titanium, tantalum or molybdenum, may be deposited over the polysilicon (gate) area 1201A and 1201B and source and drain regions 310 and 320. A thermal annealing may then be performed to create a metal-silicide compound. At this point, a top-view of FinFET 1200 is similar to the FinFET 200 shown in FIG. 11.

OTHER IMPLEMENTATIONS

In some situations it may be desirable to form strained silicon FinFETs. FIGS. 16-18 are cross-sectional views of a FinFET 1600 taken along the line A-A' in FIG. 4.

Referring to FIG. 16, a SiGe layer 1610 may be formed on a buried-oxide layer 1601. A nitride layer 1620 may be formed above the SiGe layer 1610. The arrangement of SiGe layer 1610 and nitride layer 1620 may be formed, for example, in a manner similar to the thin fin shown in FIG. 7. Thus, SiGe layer 1610 and nitride layer 1620 may be initially etched to have the same width and SiGe layer 1610 may then be laterally etched to form a thin SiGe layer 1610. SiGe layer 1610 may be about 5 nm to 15 nm wide.

Referring to FIG. 17, Si layers 1611 may next be epitaxially grown around the SiGe layer to a width of about 5 nm to 10 nm. The growth of Si layers 1611 may be followed by the formation of gate dielectric layers 1612. Gate dielectric layers 1612 may be as thin as 0.6 to 1.2 nm.

Referring to FIG. 18, a polysilicon layer 1801 may next be deposited on FinFET 1600 in a conventional manner. The polysilicon layer may then be patterned and etched to form gates of FinFET 1600. Polysilicon layer 1801 may also be planarized down to the level of nitride layer 1620. At this point, FinFET 1600 may be completed in the manner described above.

Some MOSFETs have both PMOS and NMOS FinFETs placed on a single buried oxide layer. When performing salicidation in this implementation (e.g., salicidation as described above), selective salicidation may be achieved by electroless plating of an appropriate metal. In addition, two or more different silicides may be used. One silicide (e.g., Co, Ni, rare earth metals Er, Eu, Ga, Sm) may be used for the NMOS FinFETs and another silicide (e.g., Pt) may be used for PMOS FinFETs. In this situation, the PMOS FinFETs may first be covered by a photoresist and then the NMOS metal may be deposited. The photoresist over the PMOS FinFETs may then be removed and another photoresist layer may be applied over the NMOS FinFETs. At this point, the PMOS metal may be applied. A thermal annealing may then be performed to create the metal-silicide compound.

CONCLUSION

FinFETs having a narrow fin, and methods of making the narrow fin FinFETs, were described herein. The narrow fin provides a number of advantages to the FinFET, including better short channel control.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of chemical vapor deposition (CVD) processes, including low pressure chemical vapor deposition (LPCVD) and enhanced chemical vapor deposition (ECVD) can be employed.

The present invention is applicable in the manufacturing of semiconductor devices and particularly in semiconductor devices with design features of 100 nm and below, resulting in increased transistor and circuit speeds and improved reliability. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A MOSFET device comprising:

a source and a drain structure formed on an insulating layer;

a fin structure formed on the insulating layer between the source and the drain, the fin structure including a thinned region formed in a channel area of the fin structure;

a protective layer formed over at least the thinned region of the fin structure, the protective layer having a wider width than a width of the thinned region;

a dielectric layer formed around at least a channel portion of the fin structure; and a gate formed on the insulating layer around the dielectric layer and the fin structure.

2. The device of claim 1, wherein the thinned region has a width of about 3 to 6 nm.

3. The device of claim 1, wherein the protective layer includes:

an oxide layer, and a nitride layer formed over the oxide layer.

4. The device of claim 3, wherein the oxide layer is deposited to a depth of about 15 nm and the nitride layer is deposited to a depth of about 50 nm to 75 nm.

5. The device of claim 1, wherein the dielectric layer is about 0.6 nm to 1.2 nm thick.

6. The device of claim 1, wherein the gate comprises polysilicon.

7. The device of claim 1, wherein the MOSFET device is a FinFET.

8. The device of claim 1, wherein the gate is formed to include small gate lengths.

9. A method for forming a MOSFET device comprising:

forming a source, a drain, and a fin structure on an insulating layer, portions of the fin structure acting as a channel for the MOSFET;

forming a protective layer above the fin structure;

trimming the fin structure to a width of about 3 nm to 6 nm without significantly trimming the protective layer;

forming a dielectric layer around the fin structure; and depositing a polysilicon layer around the dielectric layer, the polysilicon layer acting as a gate area for the MOSFET.

10. The method of claim 9, wherein the fin structure is trimmed by exposing the fin structure to $NH_4OH$.

11. The method of claim 9, wherein forming the protective layer includes:

depositing an oxide layer to a depth of about 15 nm, and depositing a nitride layer to a depth of about 50 nm to 75 nm.

12. The method of claim 9, further comprising:

depositing a TEOS (tetraethylorthosilicate) protective layer over the MOSFET device before trimming the fin structure.

13. The method of claim 12, further comprising:

etching away the TEOS protective layer over the fin structure before trimming the fin structure.

14. The method of claim 12, further comprising:

depositing the polysilicon layer to a depth of 50 nm to 70 nm on the TEOS protective layer.

* * * * *